United States Patent
Kobayashi et al.

(10) Patent No.: US 6,262,474 B1
(45) Date of Patent: Jul. 17, 2001

(54) SEMICONDUCTOR DEVICE (75) Inventors: Takatoshi Kobayashi; Souichi Okita; Rikihiro Maruyama, all of Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/301,716

(22) Filed: Apr. 29, 1999

(30) Foreign Application Priority Data

Jun. 1, 1998 (JP) .................................................. 10-151064

(51) Int. Cl.[7] .................................................. H01L 23/495
(52) U.S. Cl. .......................... 257/669; 257/674; 257/690; 257/678; 257/779; 257/784
(58) Field of Search ................................ 257/699, 669, 257/691, 678, 690, 693, 674, 779, 784

(56) References Cited

U.S. PATENT DOCUMENTS 5,155,660 * 10/1992 Yamada et al. .................... 361/386

FOREIGN PATENT DOCUMENTS

| 0 828 341 | 3/1998 | (EP) . |
|---|---|---|
| 2 250 379 | 6/1992 | (GB) . |
| 2 249 869 | 8/1992 | (GB) . |
| 58-112354 | 7/1983 | (JP) . |
| 63-318147 | 12/1988 | (JP) . |
| 4-32256 | 2/1992 | (JP) . |
| 4-162554 | 6/1992 | (JP) . |
| 5-15444 | 2/1993 | (JP) . |
| 6-268128 | 9/1994 | (JP) . |

* cited by examiner

*Primary Examiner*—Minh Loan Tran
*Assistant Examiner*—Luan Thai
(74) *Attorney, Agent, or Firm*—Kaensaka & Takeuchi

(57) ABSTRACT

A semiconductor device is formed of a casing, a substrate situated in the casing, at least one semiconductor chip fixed on the substrate, and at least one lead-out terminal for connecting the semiconductor chip to outside. The lead-out terminal includes a soldered portion soldered to the substrate, and a fixed portion fixed to the casing. A stress relaxing device or cutout is formed between the soldered portion and the fixed portion of the lead-out terminal to relieve stress along three axial directions orthogonal to each other. Thus, the crack formation is prevented in the soldered portion of the lead-out terminal while the resistance and impedance of the lead-out terminal are maintained at low values.

8 Claims, 7 Drawing Sheets

SEMICONDUCTOR DEVICE

BACKGROUND OF THE INVENTION AND RELATED ART STATEMENT

The present invention relates to a semiconductor device that houses semiconductor chips in a casing. More specifically, the present invention relates to a semiconductor device that facilitates electrical connection of the semiconductor chips to the outside via lead-out terminals.

The conventional semiconductor device that houses the semiconductor chips in a casing is electrically connected to the outside via lead-out terminals.

Figure 9:
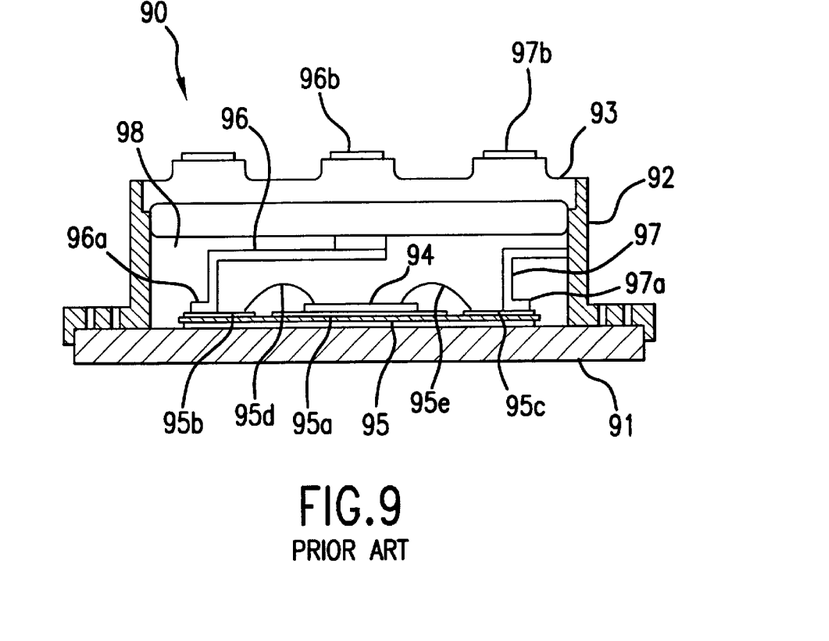
FIG. 9 is a cross sectional view of a conventional semiconductor device.

FIG. 9 is a cross sectional view of a conventional semiconductor device. Referring now to FIG. 9, a semiconductor device 90 uses a chip 94 of an insulated gate bipolar transistor (IGBT), and the chip 94 is housed in a casing formed of a metal base 91, a frame 92 and a cover 93. A substrate 95 made of ceramics, such as alumina and aluminum nitride, is mounted on the metal base 91. A pattern 95a of copper or such a conductive metal is formed on the substrate 95, and the semiconductor chip 94 is mounted on the copper pattern 95a. Patterns 95b and 95c for terminal connections are formed also on the substrate 95. The terminal connection patterns 95b and 95c are connected to the respective electrodes of the semiconductor chip 94 via respective bonding wires 95d and 95e.

A lead-out terminal 96 includes a soldering section 96a soldered to the pattern 95b, and another lead-out terminal 97 includes a soldering section 97a soldered to the pattern 95c. An end section 96b of the lead-out terminal 96 is fixed to the cover 93 such that a part of the end section 96b is exposed to the outside. An end section 97b of the lead-out terminal 97 contacts the inner side wall of the frame 92 such that a part of the end section 97b is exposed outside the cover 93 or the frame 92. Alternatively, the end section 96b of the lead-out terminal 96 may be fixed to the frame 92. The end section 97b of the lead-out terminal 97 may not contact the inner side wall of the frame 92.

The semiconductor chip 94 and the lead-out terminals 96, 97 are sealed with silicone gel 98 filled inside the frame 92.

The lead-out terminals 96 and 97 are electrically conductive thin plates, and are formed as long as possible, as far as their resistance and inductance are still low sufficiently. The lead-out terminals 96 and 97 are bent perpendicularly to the major faces. Due to these structures, the lead-out terminals 96 and 97 exhibit a capability of relaxing or relieving the stress exerted in an updown or vertical direction in FIG. 9 from outside, and the stress caused by their own thermal expansion or contraction and exerted in the vertical direction in the figure.

The shapes and arrangements of the terminals in the semiconductor device 90 as shown in FIG. 9 are determined based on the preliminary structural analysis that employs computer simulation in order to prevent crack formation at the solder. However, when a module assembled based on the results of the computer simulation is subjected to heat cycle tests, cracks are formed sometimes in the solder between the soldering section 96b of the lead-out terminal 96 and the pattern 95b.

This is presumably because the structural analysis by the computer simulation is conducted only in the two dimensions, i.e. in the up-down and right-left directions in FIG. 9, and the countermeasures for stress relaxation are taken only in the plane of the figure.

In view of the foregoing, it is an object of the invention to provide a semiconductor device that prevents crack formations in the soldered portions of the lead-out terminals while maintaining the resistance and impedance of the lead-out terminals at low values.

SUMMARY OF THE INVENTION

According to an aspect of the invention, there is provided a semiconductor device that includes a casing; one or more substrates in the casing; one or more semiconductor chips on the one or more substrates; lead-out terminals connecting the one or more semiconductor chips to the outside; and stress relaxing means. Each lead-out terminal includes soldered portions, where the lead-out terminal is soldered to the one or more substrates, and a fixed portion, where the lead-out terminal is fixed to the casing. The stress relaxing means is disposed between the soldered portion and the fixed portion of the lead-out terminal, for relaxing stress along three axes orthogonal to each other.

The stress relaxing means, that relaxes the stress exerted to the lead-out terminal along the orthogonal three axes, prevents crack formations in the soldered portion while suppressing the resistance and the impedance of the lead-out terminal at low values.

DETAILED DESCRIPTION OF PREFERRED EMBODIMENTS

Now the present invention will be explained hereinafter with reference to the accompanied drawings which illustrate the preferred embodiments of the invention.

Figure 2:
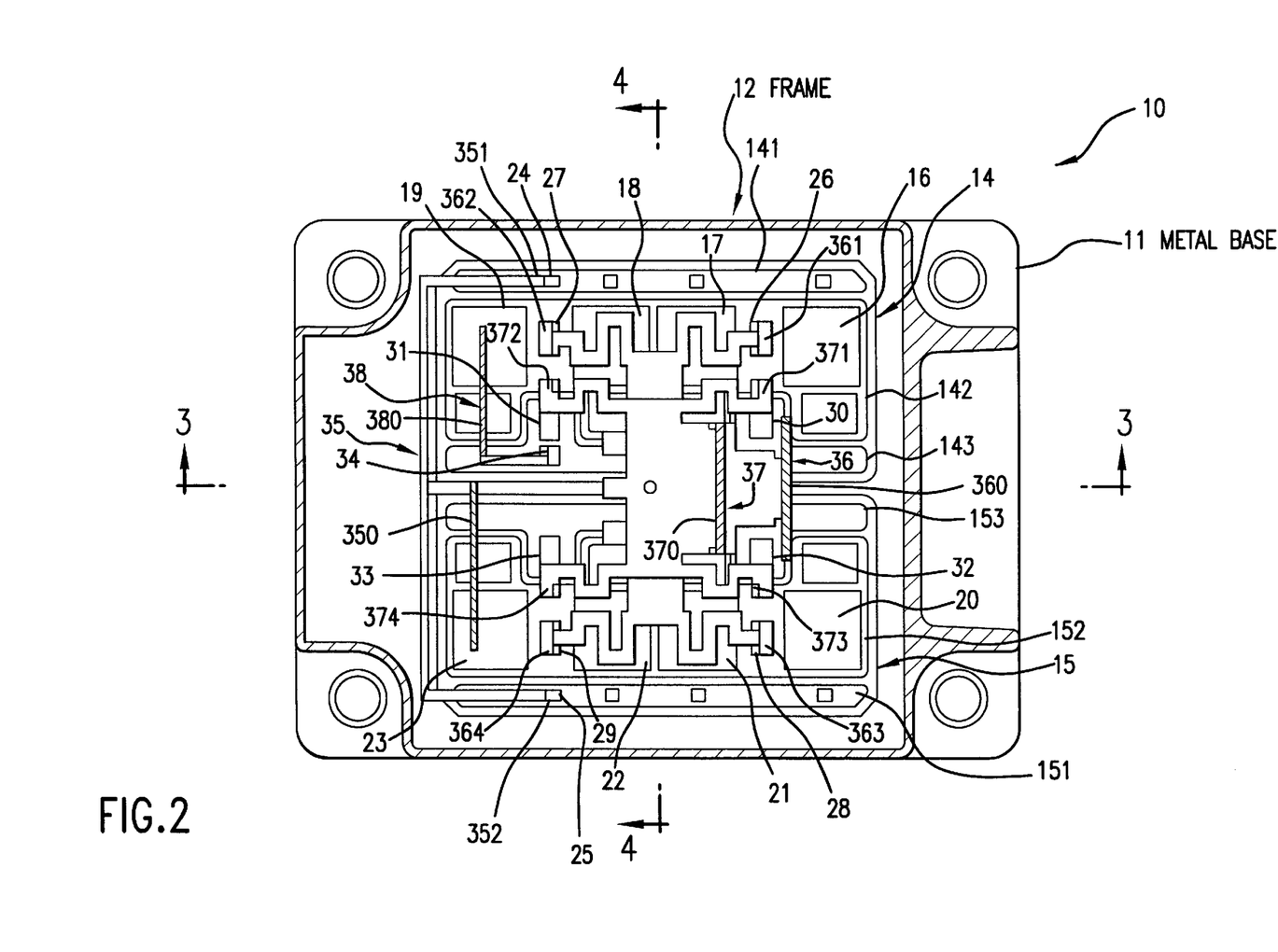
FIG. 2 is a top plan view of a semiconductor device that mounts a plurality of semiconductor chips according to an embodiment of the invention.
Figure 3:
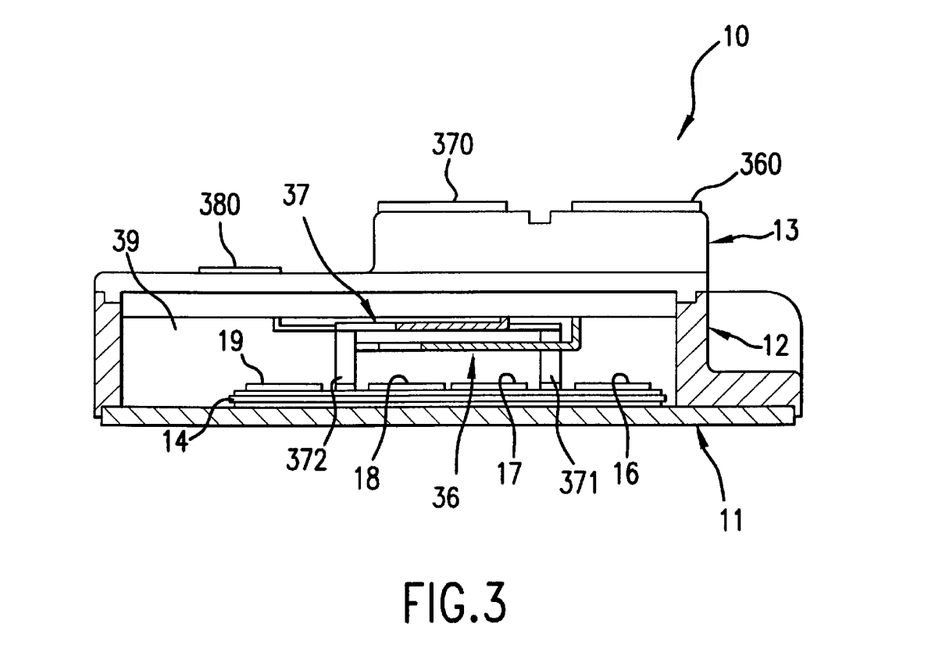
FIG. 3 is a cross sectional view taken along line 3—3 in FIG. 2.
Figure 4:
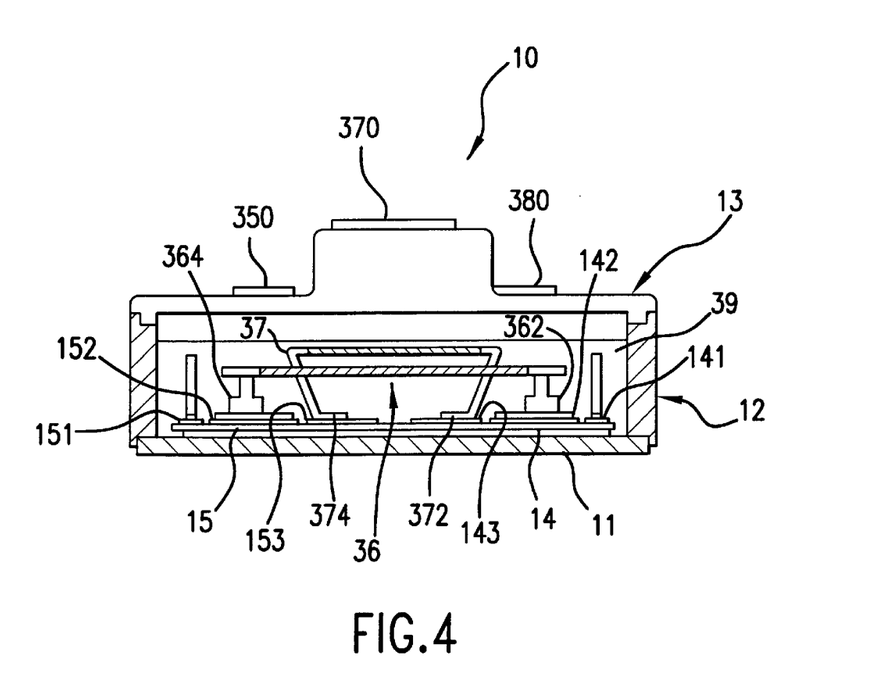
FIG. 4 is a cross sectional view taken along line 4—4 in FIG. 2.

FIG. 2 is a top plan view of a semiconductor device that mounts a plurality of semiconductor chips according to an embodiment of the invention. FIG. 3 is a cross sectional view taken along line 3—3 in FIG. 2. FIG. 4 is a cross sectional view taken along line 4—4 in FIG. 2. FIG. 2 shows only the inside of a casing. In FIGS. 3 and 4, a cover 13 is not sectioned.

Exemplary, a semiconductor device 10 in these figures is an IGBT module. The semiconductor device 10 includes a casing assembled with a metal base 11, a frame 12 and a cover 13. A pair of ceramic substrates 14 and 15 is mounted on the metal base 1. A gate circuit pattern 141, a collector circuit pattern 142 and an emitter circuit pattern 143 are formed on the ceramic substrate 14. A gate circuit pattern 151, a collector circuit pattern 152 and an emitter circuit pattern 153 are formed on the ceramic substrate 15.

Four IGBT chips 16 through 19 are mounted on the collector circuit pattern 142. Four IGBT chips 20 through 23 are mounted on the collector circuit pattern 152. The collector electrode of each IGBT chip is arranged on its bottom surface and soldered to the collector circuit pattern 142 or 152.

The emitter electrode and the gate electrode of each IGBT chip are arranged on its top surface. In addition, freewheel diodes are mounted on the collector circuit patterns 142 and 152.

A gate terminal mounting section 24 is formed on the gate circuit pattern 141, and another gate terminal mounting section 25 is formed on the gate circuit pattern 151. Similarly, collector terminal mounting sections 26, 27 are formed on the collector circuit pattern 142, and other collector terminal mounting sections 28, 29 are formed on the collector circuit pattern 152. Emitter terminal mounting sections 30, 31 are formed on the emitter circuit pattern 143 and other emitter terminal mounting sections 32, 33 are formed on the emitter circuit pattern 153. A terminal mounting section 34 for mounting an auxiliary emitter terminal is formed on the emitter circuit pattern 143.

The gate circuit pattern 141 is connected to the respective gate electrodes of the IGBT chips 16 through 19 via bonding wires (not shown). Similarly, the gate circuit pattern 151 is connected to the respective gate electrodes of the IGBT chips 20 through 23 via bonding wires (not shown). A lead-out terminal 35 is soldered to the gate circuits patterns 141 and 151 as a common gate terminal. The lead-out terminal 35 has expanded arms as shown in FIG. 2. A connecting section 351 on the end portion of one of the arms and another connecting section 352 on the end portion of the other arm are soldered to the terminal mounting sections 24 and 25, respectively. An external terminal section 350 is formed on the lead-out terminal 35. The external terminal section 350 is bent at right angles and fixed such that the external terminal section 350 is extended to the outside, as shown in FIG. 4, from the upper surface of the cover 13.

A lead-out terminal 36 is attached to the collector circuit patterns 142 and 152 as a common collector terminal. The lead-out terminal 36 includes four connecting sections 361, 362, 363 and 364 and an external terminal section 360. The connecting sections 361 and 362 are soldered to the collector terminal mounting sections 26 and 27 on the collector circuit pattern 142, respectively. The connecting sections 363 and 364 are soldered to the collector terminal mounting sections 28 and 29 on the collector circuit pattern 152, respectively. The external terminal section 360 is bent at right angles and fixed such that the external terminal section 360 is extended to the outside, as shown in FIG. 3, from the upper surface of the cover 13. The shape of the lead-out terminal 36 will be described later in detail.

The emitter circuit pattern 143 is connected to the respective emitter electrodes of the IGBT chips 16 through 19 via bonding wires (not shown). Similarly, the emitter circuit pattern 153 is connected to the respective emitter electrodes of the IGBT chips 20 through 23 via bonding wires (not shown). A lead-out terminal 37 is attached to the emitter circuit patterns 143 and 153 as a common emitter terminal.

The lead-out terminal 37 includes four connecting sections 371, 372, 373 and 374 and an external terminal section 370. The connecting sections 371 and 372 are soldered to the terminal mounting sections 30 and 31 on the emitter circuit pattern 143, respectively. The connecting sections 373 and 374 are soldered to the terminal mounting sections 32 and 33 on the emitter circuit pattern 153, respectively. The external terminal section 370 is bent at right angles and fixed such that the external terminal section 370 is extended to the outside, as shown in FIGS. 3 and 4, from the upper surface of the cover 13.

A lead-out terminal 38 is soldered to the terminal mounting section 34 on the emitter circuit pattern 143 as an auxiliary emitter terminal. The lead-out terminal 38 includes an external terminal section 380, that is bent at right angles and fixed such that the external terminal section 380 is extended to the outside, as shown in FIGS. 3 and 4, from the upper surface of the cover 13.

The semiconductor chips and the lead-out terminals described above are sealed with silicone gel 39 filled inside the framework 12.

Now the shape of the lead-out terminals will be described in detail.

Figure 1:
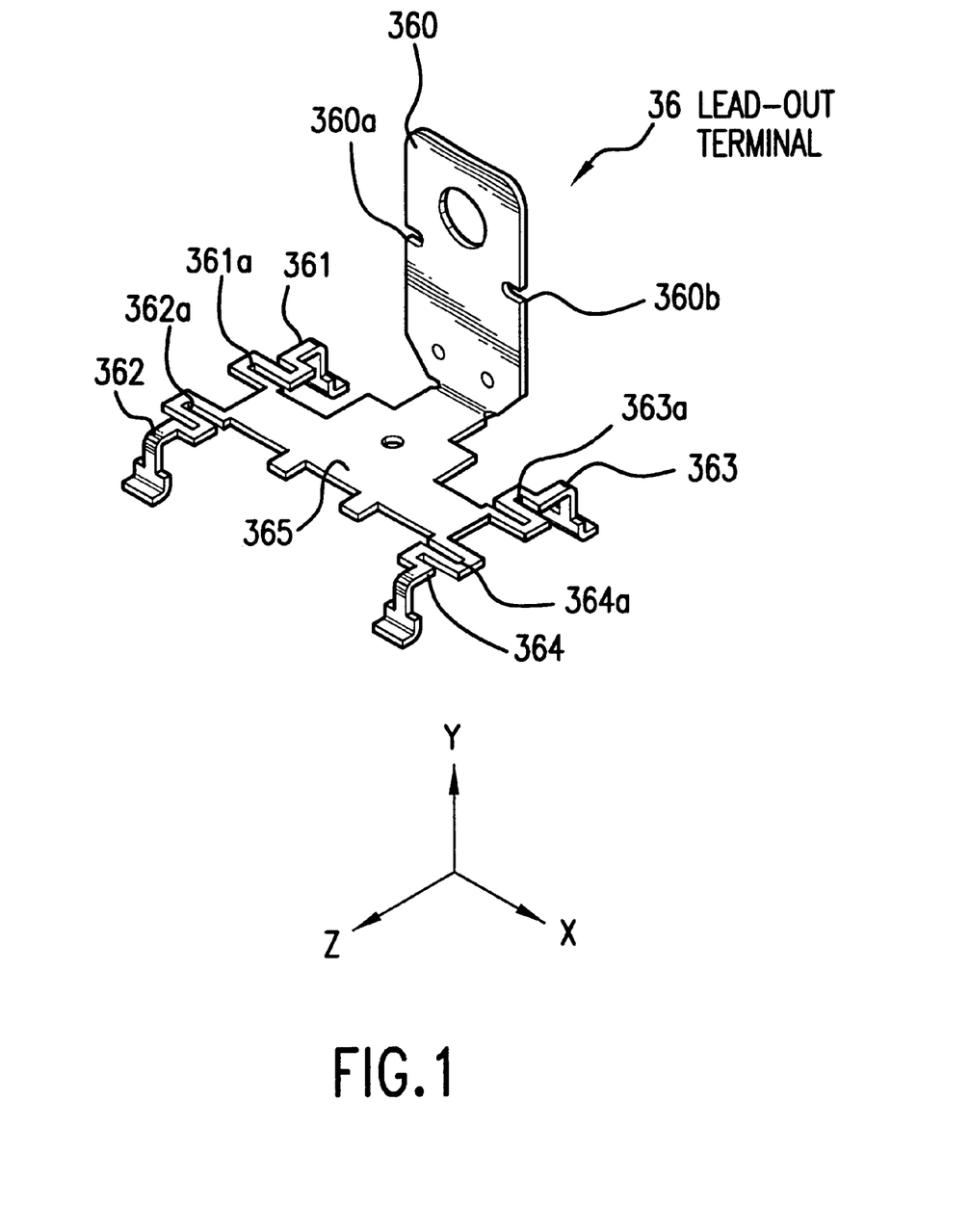
FIG. 1 is a perspective view of an embodiment of a lead-out terminal according to the invention.

FIG. 1 is a perspective view of the lead-out terminal 36. Referring now to FIG. 1, The lead-out terminal 36 is formed by punching a metal plate and bending the punched out metal plate such that the external terminal section 360 extends parallel to the Y-axis when a flat plate section 365 is positioned parallel to the Z-X plane. The flat plate section 365 is fixed to the frame 12 by a beam-shaped support (not shown) extending from the frame 12. Two cutouts 360a and 360b are formed in the middle part of the external terminal section 360 such that the cutouts 360a and 360b face opposite to each other. The external terminal section 360 is bent at right angles along the cutouts 360a and 360b and fixed to the cover 13 as shown in FIG. 3.

The connecting sections 361, 362, 363 and 364 are made much longer as compared to the thickness. The connecting sections 361, 362, 363 and 364 extend in the Z-axis direction from the flat plate section 365 parallel to the flat plate section 365. The connecting sections 361, 362, 363 and 364 are bent downwardly at their middle portions. A plurality of cutouts 361a is formed in the connecting section 361; a plurality of cutouts 362a is formed in the connecting section 362; a plurality of cutouts 363a is formed in the connecting section 363; and a plurality of cutouts 364a is formed in the connecting section 364, as stress relaxing or relieving means. The cutouts 361a, 362a, 363a and 364a are formed, for example, along the X-axis. In each connecting section, the adjacent cutouts parallel to each other extend in opposite directions. The depth and the number of the cutouts are determined considering the resistance and the inductance of the connecting sections 361, 362, 363 and 364.

In the lead-out terminal 36 structured as described above, the cutouts 361a, 362a, 363a and 364a allow the respective connecting sections 361, 362, 363 and 364 to have elasticity, that is elastic enough to relax the stress exerted along X- and Z-axes as well as along the Y-axis (vertical direction).

The lead-out terminal 37 has a structure almost the same as that of the lead-out terminal 36, though the dimensions and the shapes of the lead-out terminal 37 are partly different from those of the lead-out terminal 36. Cutouts similar to the cutout 361a are formed in the connecting sections of the lead-out terminals 35 and 38.

Now the properties of the lead-out terminals 35, 36 and 37 will be explained.

The lead-out terminals 35, 36 and 37 are soldered onto the ceramic substrates 14 and 15. The temperature of the semiconductor device is changed between 25° C. and 125° C., and the displacements (mm) of the soldered portions of the lead-out terminals 35, 36 and 37 are measured. For example, the soldered portion is the portion of the connecting section 361 or 362, where the connecting section 361 or 362 is soldered to the ceramic substrate 14, or the portion of the connecting section 363 or 364, where the connecting section 363 or 364 is soldered to the ceramic substrate 15. The deflections (mm/kg) caused by the load of 1 kg are also measured. Here, the deflection means a deflection between the soldered portion and a fixed portion of each lead-out terminal. The fixed portion is the portion of the lead-out terminal 35, 36 or 37 fixed to somewhere, where the lead-out terminal 35, 36 or 37 is fixed to the frame 12 directly, or to the support extended from the frame 12 or to the cover 13. Although the usual heat cycle tests are conducted between −40° C. and 125° C., the temperature is changed between 25° C. and 125° C. in the present invention assuming that any deformation will not be caused practically at the ordinary temperature.

Figure 5:
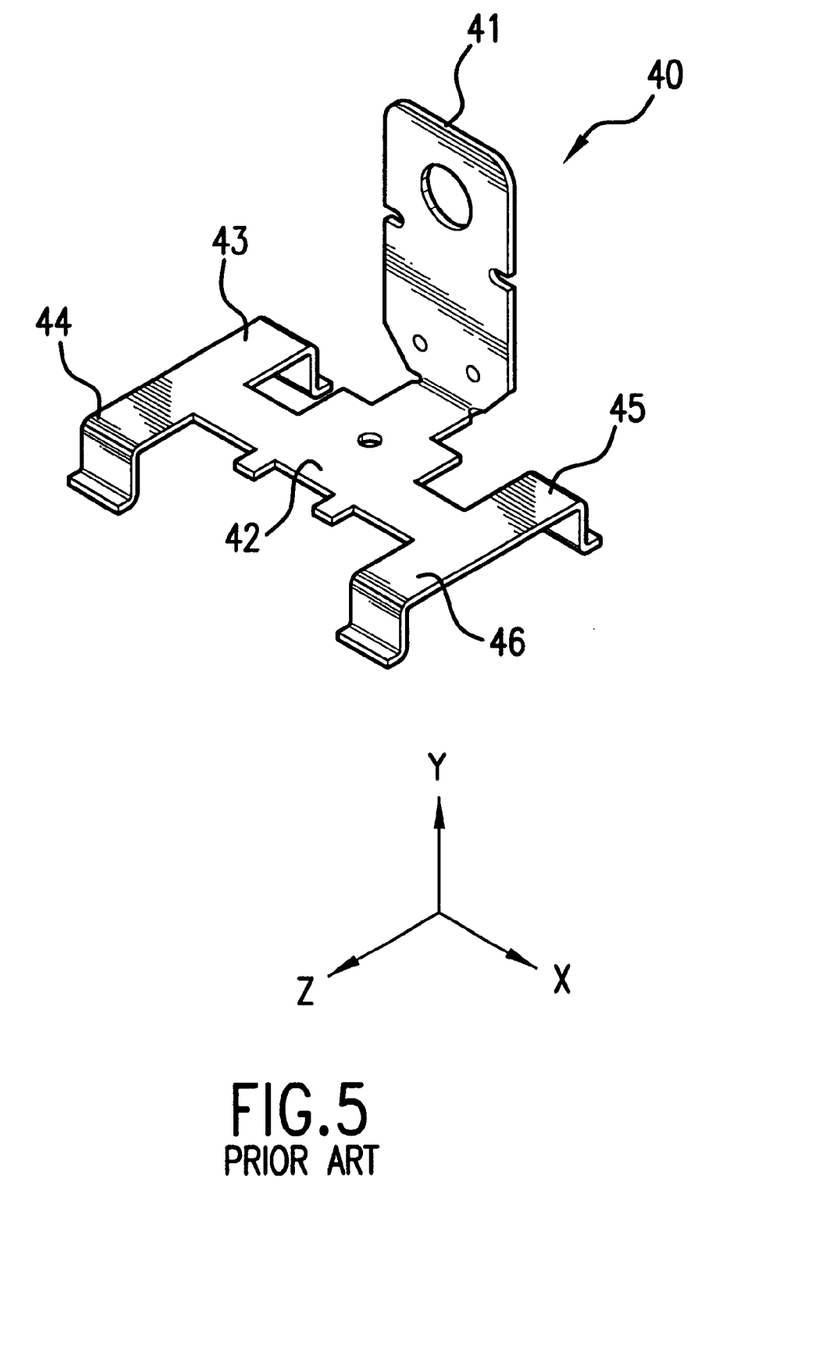
FIG. 5 is a perspective view of a conventional lead-out terminal.

FIG. 5 is a perspective view of a conventional lead-out terminal. A similar test is conducted also to the conventional lead-out terminal that does not have any stress relaxing means. Referring now to FIG. 5, the conventional lead-out terminal 40 includes an external terminal section 41 and a flat plate section 42, which have the dimensions and the shapes almost the same as those of the lead-out terminal 36 according to the invention. However, the conventional lead-out terminal 40 does not have any cutout as the stress relaxing means in its connecting sections 43, 44, 45 and 46.

Figure 6:
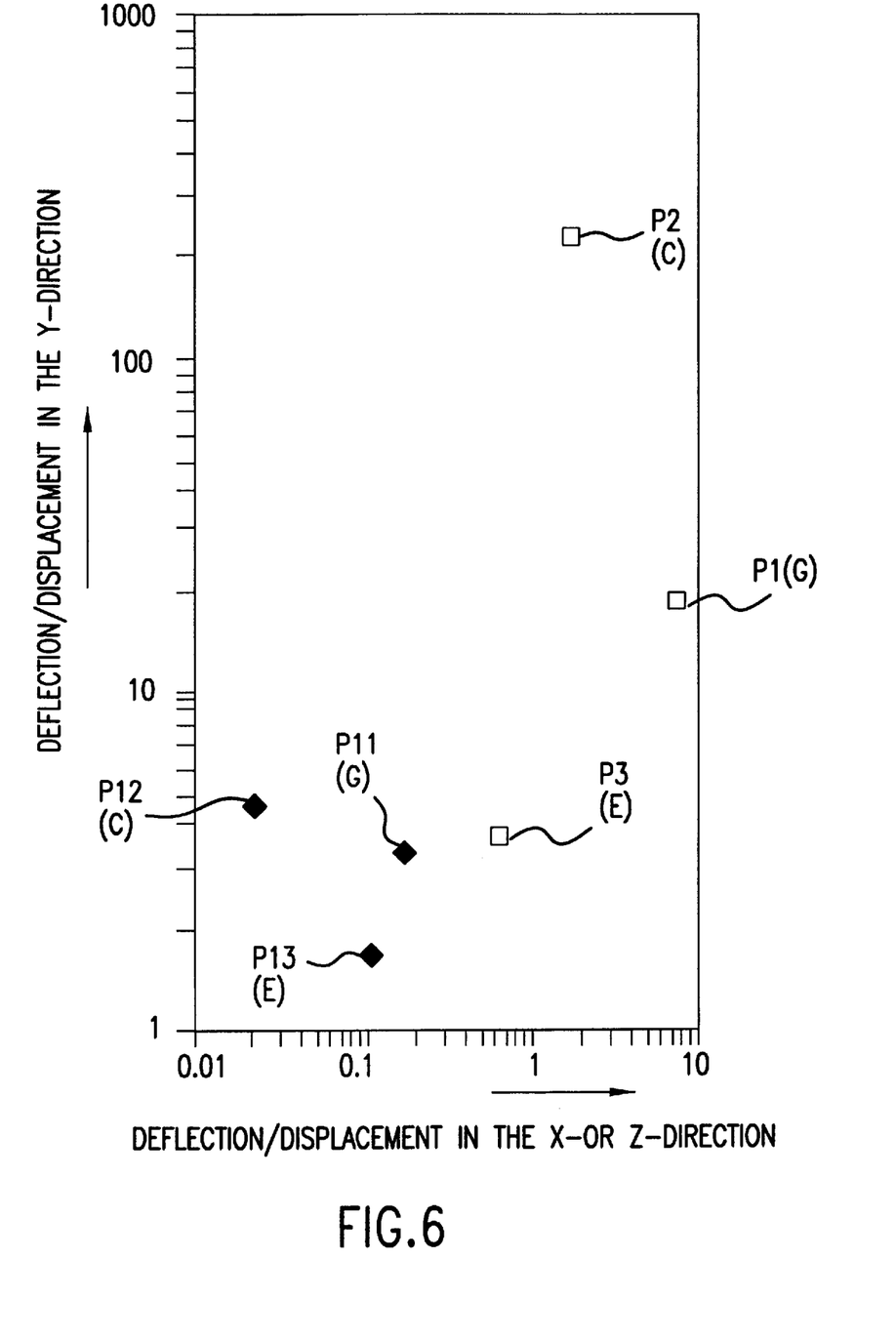
FIG. 6 is a chart comparing the ratios of the deflection and displacement caused in the conventional lead-out terminal as described in FIG. 5 and the lead-out terminal according to the invention.

FIG. 6 is a chart comparing the ratios of the deflection and the displacement caused in the conventional lead-out terminal as described in FIG. 5 and the lead-out terminal according to the present invention. In FIG. 6, the axis of abscissa represents the ratio of the deflection and the displacement along the X- or Z-axis, and the axis of ordinate represents the ratio of the deflection and the displacement along the Y-axis. The point P1 in the figure represents the ratio of the deflection and the displacement caused in the lead-out terminal 35 for the gate (G). The point P2 represents the ratio of the deflection and the displacement caused in the lead-out terminal 36 for the collector (C). The point P3 represents the ratio of the deflection and the displacement caused in the lead-out terminal 37 for the emitter (E). The points P11, P12 and P13 represents the ratios of the deflection and the displacement caused respectively in the conventional lead-out terminals for the gate (G), for the collector (C) and for the emitter (E).

As FIG. 6 indicates, the deflections with respect to the respective displacements in the lead-out terminals 35, 36 and 37 according to the invention are greater as compared to the deflections with respect to the respective displacements in the conventional lead-out terminals.

Then, crack formations in the soldered portions of the conventional lead-out terminals and the present lead-out terminals are studied.

Figure 7:
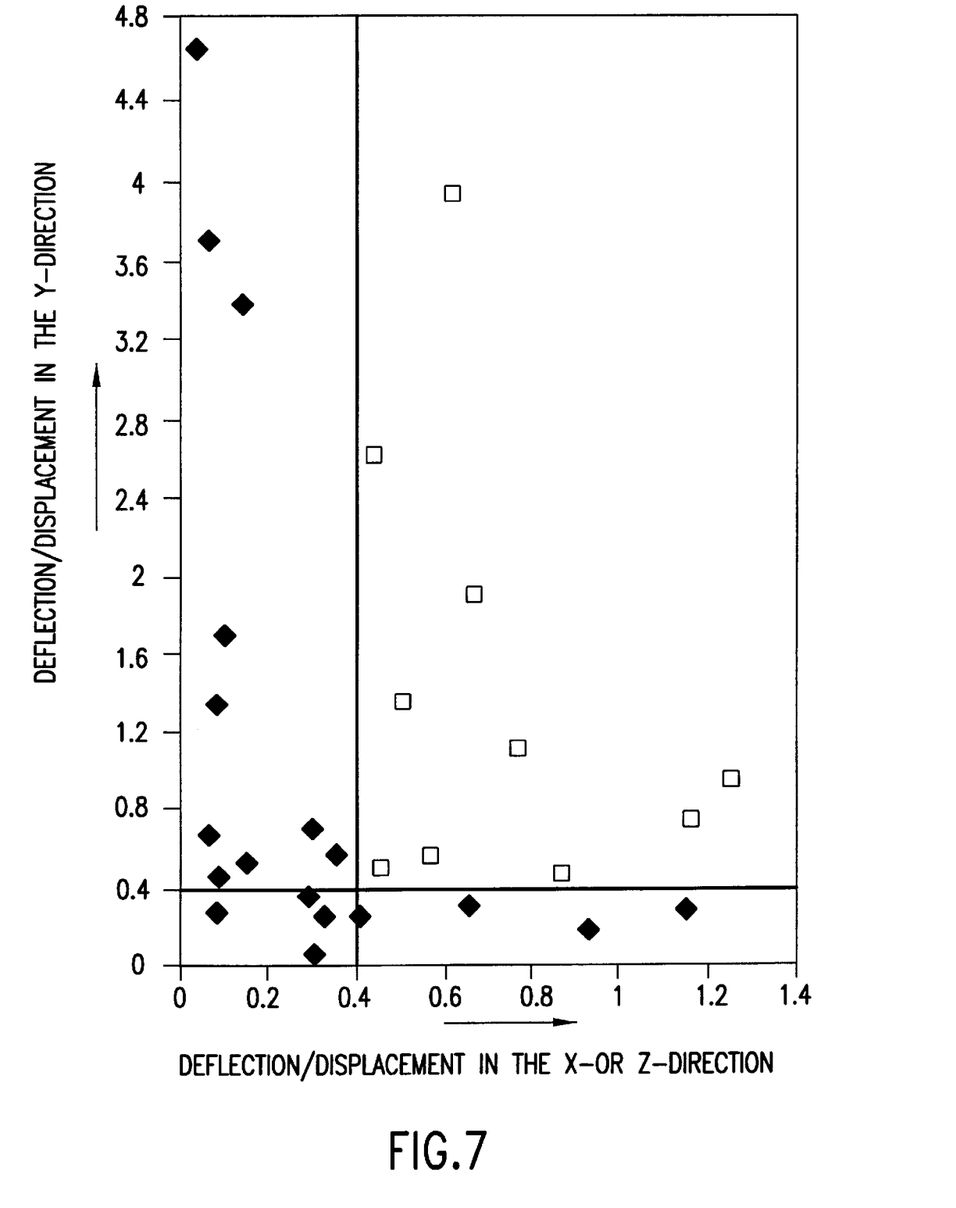
FIG. 7 is a chart relating to the ratios of the deflection and displacement caused in the lead-out terminals with crack formation.

FIG. 7 is a chart relating to the ratios of the deflection and the displacement caused in the lead-out terminals with respect to the crack formation. In FIG. 7, white square signs represent no crack formation and black square signs represent crack formation. As FIG. 7 indicates, cracks are formed when the ratio of the deflection and the displacement is less than 0.4 along either one of the three axes. According to the invention, the ratio of the deflection and the displacement is set at 0.4 or larger by adjusting the number and the depth of the cutouts 361a and the like. Therefore, the lead-out terminal according to the invention can prevent crack formations.

When the lead-out terminal is provided with too many cutouts for increasing the ratio of the deflection and the displacement, high resistance and high impedance are caused in the lead-out terminal or the lead-out terminal becomes too large to be housed in the frame 12. Therefore, it is preferable to set the ratio of the deflection and the displacement to be slightly larger than 0.4.

Figure 8:
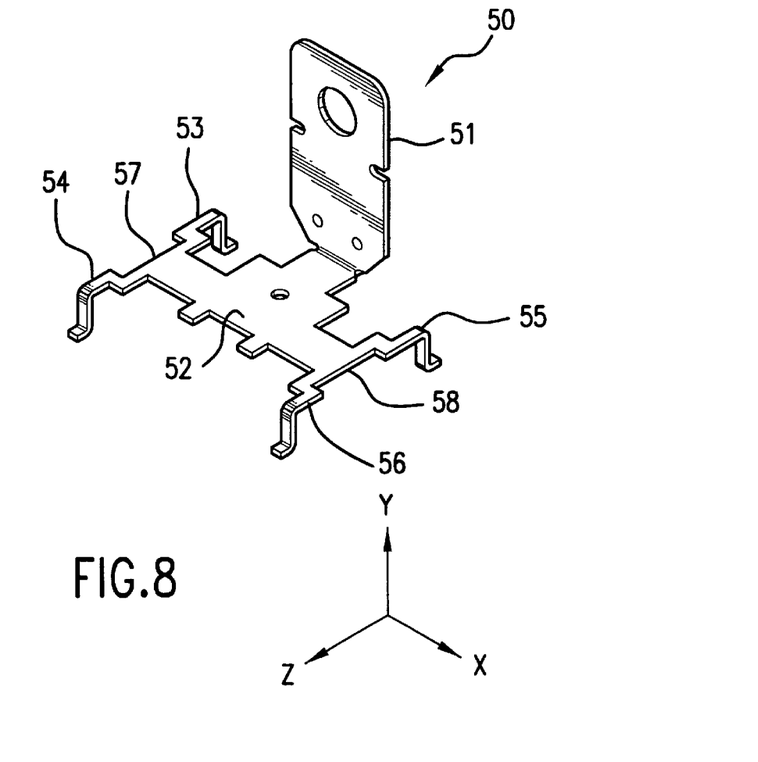
FIG. 8 is a perspective view of another embodiment of a lead-out terminal according to the invention.

FIG. 8 is a perspective view of another embodiment of a lead-out terminal according to the invention. Referring now to FIG. 8, the lead-out terminal 50 includes an external terminal section 51 and a flat plate section 52 similar to the lead-out terminal 36 of FIG. 1. Four connecting sections 53, 54, 55 and 56 extend from the flat plate section 52. A cutout 57 is formed between the connecting sections 53 and 54, and another cutout 58 is formed between the connecting sections 55 and 56. Each connecting section includes a plurality of bent portions. These cutouts and bent portions provide the lead-out terminal 50 with a capability of relaxing the stress along the Z- and X-axes as well as the stress along the Y-axis.

As explained above, the stress relaxing means disposed between the section where the lead-out terminal is soldered to the substrate and the section where the lead-out terminal is fixed to the casing, for relaxing the stress along the three axes perpendicular to each other according to the invention can prevent crack formations in the soldered portions of the lead-out terminal while maintaining the resistance and the impedance of the lead-out terminal at the low values.

What is claimed is:

1. A semiconductor device comprising:

a casing;

a substrate situated in the casing;

at least one semiconductor chip fixed on the substrate;

at least one lead-out terminal for connecting the at least one semiconductor chip to outside, said at least one lead-out terminal having a fixed portion fixed to the casing and a plurality of soldered portions branching from the fixed portion and soldered to the substrate; and stress relaxing means disposed between the soldered portion and the fixed portion of the at least one lead-out terminal, said stress relaxing means being arranged such that a ratio of deflection between the soldered portion and the fixed portion relative to displacement at the soldered portion, to which a predetermined temperature change is applied, is at least 0.4 and relieving stress along three axial directions orthogonal to each other.

2. A semiconductor device according to claim 1, wherein said stress relaxing means comprises cutouts extending perpendicularly to a longitudinal direction of the lead-out terminal.

3. A semiconductor device according to claim 1, wherein said at least one lead-out terminal includes a connecting section between the soldered portion and the fixed portion, said stress relaxing means being formed in the connecting section and including at least two cutouts extending substantially parallel to each other and having open sides, said open sides facing opposite to each other.

4. A semiconductor device according to claim 3, wherein said connecting section includes a lateral portion fixed to the fixed portion and a vertical section fixed to the soldered portion.

5. A semiconductor device according to claim 4, wherein said at least one lead-out terminal includes a plurality of connecting sections with the cutouts, arranged laterally symmetrically relative to each other.

6. A semiconductor device according to claim 1, wherein said at least one lead-out terminal further includes a flat plate section disposed perpendicularly to the fixed portion, each of said plurality of soldered portions being connected to the flat plate section through one stress relaxing means.

7. A semiconductor device according to claim 6, wherein said stress relaxing means is formed of a lateral portion extending parallel to the flat plate section and including a plurality of linear lines extending perpendicular to each other, and one vertical section perpendicular to the lateral portion and connected to the soldered portion.

8. A semiconductor device according to claim 7, wherein one combination of the vertical section and the linear lines of the relaxing means are arranged symmetrical to another combination of the vertical section and linear lines situated adjacent thereto relative to a center line of the flat plate section.

* * * * *